United States Patent
Hijmans et al.

(10) Patent No.: US 10,227,145 B2
(45) Date of Patent: Mar. 12, 2019

(54) TRUSS STRUCTURE

(71) Applicant: Space Systems/Loral, LLC, Palo Alto, CA (US)

(72) Inventors: Carey Graham Hijmans, Morgan Hill, CA (US); Michael Paul Freestone, El Granada, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 93 days.

(21) Appl. No.: 15/053,998

(22) Filed: Feb. 25, 2016

(65) Prior Publication Data

US 2016/0251093 A1  Sep. 1, 2016

Related U.S. Application Data

(60) Provisional application No. 62/126,335, filed on Feb. 27, 2015, provisional application No. 62/126,332, filed on Feb. 27, 2015.

(51) Int. Cl.
*B64G 1/10* (2006.01)
*B64G 99/00* (2009.01)
(Continued)

(52) U.S. Cl.
CPC .............. *B64G 9/00* (2013.01); *B64G 1/10* (2013.01); *F16B 7/00* (2013.01); *F16B 7/185* (2013.01);
(Continued)

(58) Field of Classification Search
CPC .................................... B64G 1/00; B64G 9/00
See application file for complete search history.

(56) References Cited

U.S. PATENT DOCUMENTS 3,386,745 A * 6/1968 Hein ............... F16L 17/025
                                                     277/605
3,665,670 A * 5/1972 Rummler ........... E04L 31/1903
                                                     403/231
(Continued)

FOREIGN PATENT DOCUMENTS

CN         102867101 A      1/2013
CN         103412997 A     11/2013
WO    WO 2015/175892 A1   11/2015

OTHER PUBLICATIONS

US Provisional Patent Application filed Jul. 2, 2014 entitled "Systems and Methods for Fabricating Joint Members".
(Continued)

*Primary Examiner* — Justin M Benedik
(74) *Attorney, Agent, or Firm* — Weaver Austin Villeneuve & Sampson LLP

(57) ABSTRACT

A spacecraft includes a 3-D closed truss structure including at least four coupling nodes and at least six strut elements, attached together by a plurality of joints, each coupling node including at least two legs, each strut element disposed between and attached with a respective pair of the plurality of coupling nodes. Each coupling node is attached, at respective ones of the plurality of joints, with at least two strut elements. Each strut element is attached at a first end with a first leg of a first coupling node and is attached at a second end with a second leg of a second coupling node, the first leg being substantially longer than the second leg.

17 Claims, 14 Drawing Sheets

(51) Int. Cl.
*G06F 17/50* (2006.01)
*F16B 7/00* (2006.01)
*F16B 7/18* (2006.01)
*F16B 11/00* (2006.01)

(52) U.S. Cl.
CPC ........ *F16B 11/008* (2013.01); *G06F 17/5018* (2013.01)

(56) References Cited

U.S. PATENT DOCUMENTS

| | | | | |
|---|---|---|---|---|
| 3,847,694 | A * | 11/1974 | Stewing | B29C 61/00 156/86 |
| 3,920,268 | A * | 11/1975 | Stewing | B29C 65/42 138/155 |
| 4,084,827 | A * | 4/1978 | Wolf | F16L 21/022 277/607 |
| 4,211,259 | A * | 7/1980 | Butler | B29C 65/42 138/109 |
| 4,213,619 | A * | 7/1980 | Arlt | F16L 17/025 277/607 |
| 4,612,750 | A * | 9/1986 | Maistre | B64G 9/00 52/638 |
| 4,624,599 | A | 11/1986 | Piasecki | |
| 4,637,193 | A | 1/1987 | Lange | |
| 4,697,767 | A | 10/1987 | Witten et al. | |
| 4,801,159 | A * | 1/1989 | Sehorn | F16L 58/1081 285/148.13 |
| 4,982,546 | A | 1/1991 | Lange | |
| 7,922,179 | B2 * | 4/2011 | Andrick | B28B 21/563 277/615 |
| 8,126,684 | B2 | 2/2012 | Goel et al. | |
| 8,784,998 | B2 * | 7/2014 | Cap | B23K 20/12 428/651 |
| 8,855,977 | B2 | 10/2014 | Hallquist | |
| 9,512,949 | B2 * | 12/2016 | Kauppi | A61M 16/0816 |
| 10,112,731 | B2 | 10/2018 | Rodrigues et al. | |
| 2003/0216894 | A1 | 11/2003 | Ghaboussi et al. | |
| 2004/0128940 | A1 * | 7/2004 | LaForge | E04H 12/10 52/655.1 |
| 2005/0126106 | A1 | 6/2005 | Murphy et al. | |
| 2008/0300831 | A1 | 12/2008 | Taggart et al. | |
| 2010/0005752 | A1 | 1/2010 | Hawkins et al. | |
| 2011/0108090 | A1 | 5/2011 | Lance et al. | |
| 2012/0215498 | A1 | 8/2012 | Hallquist | |
| 2013/0185030 | A1 | 7/2013 | Hallquist | |
| 2013/0232907 | A1 | 9/2013 | Jones, III | |
| 2014/0252744 | A1 | 9/2014 | D'Aluisio | |
| 2016/0016229 | A1 * | 1/2016 | Czinger | B22F 3/1055 296/205 |

OTHER PUBLICATIONS

ATK An Advanced Weapon and Space Systems Company, "CCAT ATK Composite Strut Study Final Report," Dec. 13, 2010, 69 pages.
Kohta et al., "A design method for optimal truss structures with certain redundancy based on combinatorial rigidity theory," 10th World Congress on Structural and Multidisciplinary Optimization, May 19-24, 2013, Orlando, FL., 10 pages.
Li et al., "Truss topology optimization with species conserving genetic algorithm," IEEE, 2014, 7 pages.
International Search Report and Written Opinion dated Jun. 1, 2016 issued in PCT/US2016/019855.
International Preliminary Report on Patentability dated Sep. 8, 2017 issued in PCT/US2016/019855.
Office Action dated Feb. 8, 2018 for U.S. Appl. No. 15/053,993.
U.S. Notice of Allowance dated Jun. 29, 2018 in U.S. Appl. No. 15/053,993.

* cited by examiner

Detail C

Detail D

TRUSS STRUCTURE

CROSS-REFERENCE TO RELATED APPLICATIONS

This disclosure claims priority to U.S. Provisional Patent Application No. 62/126,335; filed Feb. 27, 2015, entitled "TRUSS STRUCTURE," and assigned to the assignee hereof, and to U.S. Provisional Patent Application No. 62/126,332; filed Feb. 27, 2015, entitled "TRUSS STRUCTURE OPTIMIZATION TECHNIQUES," and assigned to the assignee hereof, the disclosures of which are hereby incorporated by reference in their entireties into this Patent Application.

TECHNICAL FIELD

This invention relates generally to truss-like structures, and more particularly to techniques for fabricating composite truss structures.

BACKGROUND

The assignee of the present invention manufactures and deploys spacecraft for, inter alia, communications and broadcast services. Such spacecraft may include a large variety of payload equipment (e.g., electronics, antennas, antenna feeds, imaging systems) and bus equipment (e.g., propulsion equipment, attitude control electronics, sensors and actuators, solar arrays and batteries) mechanically coupled with a spacecraft structural support system. The spacecraft structural support system may be required to sustain large loads during launch, to experience large daily temperature excursions during the spacecraft's lifetime, and may be required to maintain precise respective alignment of various components mounted thereon.

A variety of structural elements may be configured to meet the aforementioned requirements while also seeking to achieve objectives of low mass, low coefficient of thermal expansion and high rigidity. Truss-like structures such as those disclosed in US Patent Publication No. 2004/0128940, assigned to the assignee of the present invention, and U.S. Pat. No. 3,665,670 have been found to provide desirably lightweight and rigid spacecraft structures. Fabrication of such structures, in the absence of the presently disclosed techniques, has proven expensive and time-consuming.

SUMMARY

The presently disclosed techniques relate to an improved truss-like structure and techniques for fabricating such truss structures. The techniques particularly, though not exclusively, relate to a 3-D closed truss structure for use as a primary or secondary structure of a spacecraft. As described in more detail below, the presently disclosed techniques contemplate rapid assembly of rigid, accurately alignable truss structures of considerable size by (1) forming a dry fit assembly of the structure, the dry fit assembly being self-supporting and yet capable of manual adjustment for alignment purposes, (2) performing alignment on the dry fit assembly as a whole, prior to rigidizing the joints; and (3) rigidizing the joints without disassembling the joints.

According to some implementations, a spacecraft includes a 3-D closed truss structure including at least four coupling nodes and at least six strut elements, attached together by a plurality of joints, each coupling node including at least two legs, each strut element disposed between and attached with a respective pair of the plurality of coupling nodes. Each coupling node is attached, at respective ones of the plurality of joints, with at least two strut elements. Each strut element is attached at a first end with a first leg of a first coupling node and is attached at a second end with a second leg of a second coupling node, the first leg being substantially longer than the second leg.

In some examples, the truss structure may be configured to be fabricated by forming a dry fit assembly of the plurality of coupling nodes and the plurality of strut elements, the dry fit assembly being self-supporting, aligning the dry fit assembly, and rigidizing each joint. In some examples, the dry fit assembly may include one or more dry fitted joints configured to resist gravitational forces and incidental contact, and to yield to a persistently applied force in the range of about 5-30 pounds. In some examples, rigidizing each joint may include affixing each joint with an adhesive. In some examples, rigidizing each joint may include injecting an adhesive between mating surfaces of a respective coupling node and strut element and allowing the adhesive to cure. In some examples, between the step of aligning the dry fit assembly and the step of rigidizing each joint, disassembly of any joint may be avoided.

In some examples, at least one of the plurality of strut elements may be a thin-walled structural member fabricated from a carbon composite material.

In some examples, at least one of the plurality of coupling nodes may be produced using an additive manufacturing method.

In some examples, each joint may include one or both of an O-ring and an elastomeric insert.

In some examples, each joint may include a coupling node, a strut element and at least one O-ring, and the strut element has a sliding fit with respect to the respective coupling node and the least one O-ring.

In some examples, each joint may include a coupling node, a strut element and at least one elastomeric insert, the elastic insert including a compliant seal having an outer edge surface configured to engage with an internal mating surface of a strut element. In some examples, each joint may include an external seal disposed proximate to an end facing surface of the strut element.

In some examples, an outer diameter of a leg of at least one coupling node may be less than an inner diameter of a mating strut element.

In some examples, the truss structure may include at least ten coupling nodes, be at least 100 ft.$^3$ in volume, have a stiffness corresponding to a first resonance frequency of 20 Hz or higher and have an alignment accuracy of better than 0.01 inches or 0.05 degrees.

According to some implementations, a structure includes a plurality of coupling nodes and a plurality of strut elements, each strut element disposed between and attached with a respective pair of the plurality of coupling nodes. The structure is a 3-D closed truss structure including at least four coupling nodes and at least six strut elements connected at a plurality of joints, wherein each coupling node is attached with at least two strut elements, the structure being configured to be fabricated by forming a dry fit assembly of the plurality of coupling nodes and the plurality of strut elements, the dry fit assembly being self-supporting, aligning the dry fit assembly; and rigidizing each joint.

In some examples, rigidizing each joint may include affixing each joint with an adhesive.

In some examples, between the step of aligning the dry fit assembly and the step of rigidizing each joint, disassembly of any joint may be avoided.

In some examples, each strut element may be attached at a first end with a first leg of a first coupling node and may be attached at a second end with a second leg of a second coupling node, each coupling node including a plurality of legs, and the first leg may be substantially longer than the second leg.

According to some implementations, a method for fabricating a structure includes: (i) forming a dry fit assembly of a 3-D closed truss structure including at least four coupling nodes and at least six strut elements connected at a plurality of joints, each coupling node being attached with at least two strut elements, each strut element disposed between and attached with a respective pair of the plurality of coupling nodes, the dry fit assembly being self-supporting; (ii) aligning the dry fit assembly; and (iii) rigidizing each joint.

In some examples, each strut element may be attached at a first end with a first leg of a first coupling node and is attached at a second end with a second leg of a second coupling node, the first leg being substantially longer than the second leg.

BRIEF DESCRIPTION OF THE DRAWINGS

Features of the invention are more fully disclosed in the following detailed description of the preferred embodiments, reference being had to the accompanying drawings, in which like reference numerals designate like structural element, and in which.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when a feature is referred to as being "connected" or "coupled" to another feature, it can be directly connected or coupled to the other feature, or intervening feature s may be present. It will be understood that although the terms "first" and "second" are used herein to describe various features, these features should not be limited by these terms. These terms are used only to distinguish one feature from another feature. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Figure 1:
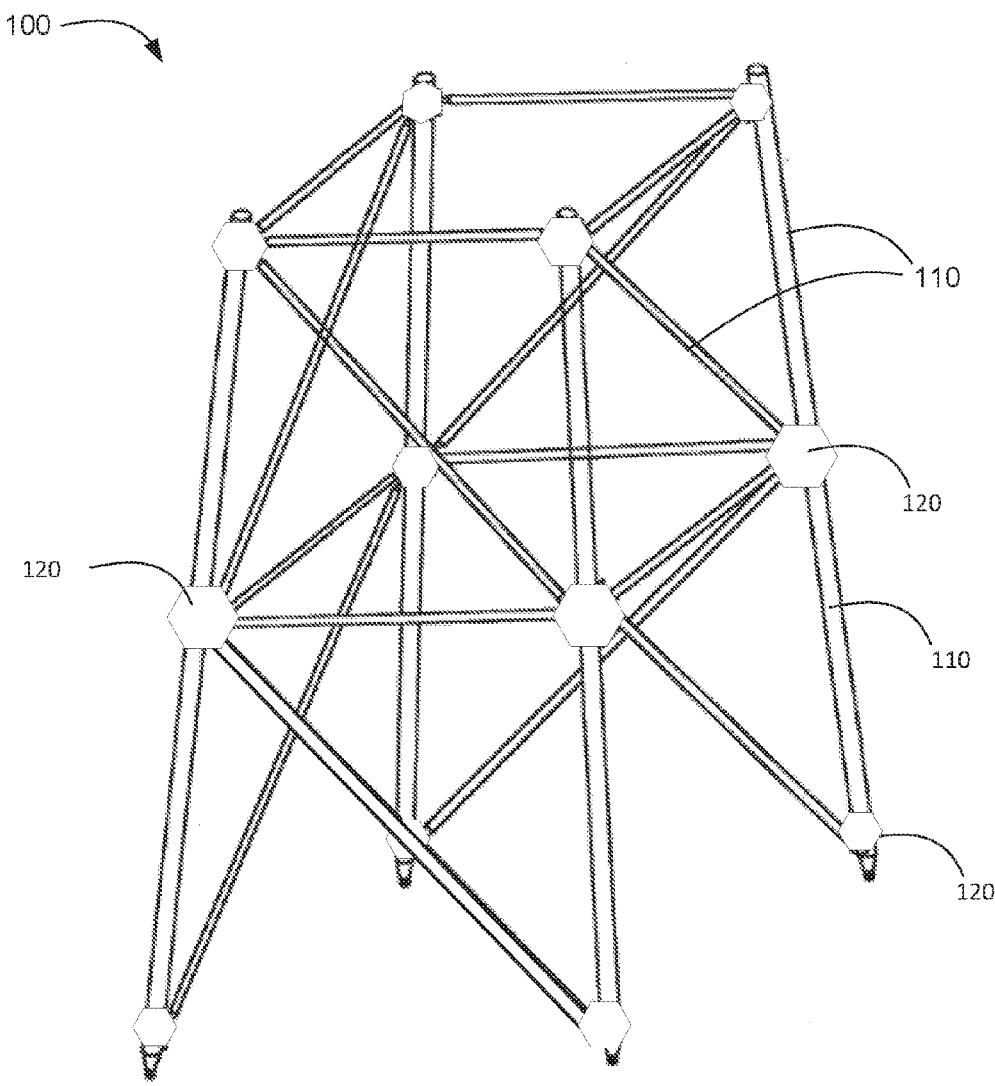
FIG. 1 illustrates an example of a 3-D truss structure.

A truss-like frame structure for space applications may include a number of coupling fittings ("coupling nodes" or "nodes") connected by strut elements. Referring now to FIG. 1, structure 100 includes strut elements 110, each strut element 110 being disposed between and mechanically coupling a pair of nodes 120. Each node 120 may be connected to two or more strut elements 110. In order to obtain a desirably rigid and well-aligned structure, each mechanical joint between a strut element 110 and a node 120 must likewise be rigidly secured and precisely located. In the absence of the present teachings, a truss-like structure is built up sequentially, that is each of a sequential series of strut/node joints, each joint including a number of mechanical components, may be preliminarily fit in and then finally aligned and affixed/rigidized before the next joint in the sequence. As a result, fabrication of such structures is time-consuming and expensive.

The presently disclosed techniques enable fabrication of a complex truss-like structural arrangement in a more time and cost effective manner, and using considerably fewer components than conventional techniques for fabricating a truss-like structure. In some implementations, the structural arrangement is assembled by "dry fitting" all or a major fraction of the strut/node joints. The dry fit assembly, advantageously, may be self-supporting and yet be amenable to manual adjustment for alignment purposes. Following alignment of the structural arrangement as a whole, or of major subassemblies thereof, the joints may be rigidly affixed ("rigidized") without disassembling the dry fitted joints. For example, an adhesive may be injected between mating surfaces of the dry fitted joints and allowed to cure.

Figure 2:
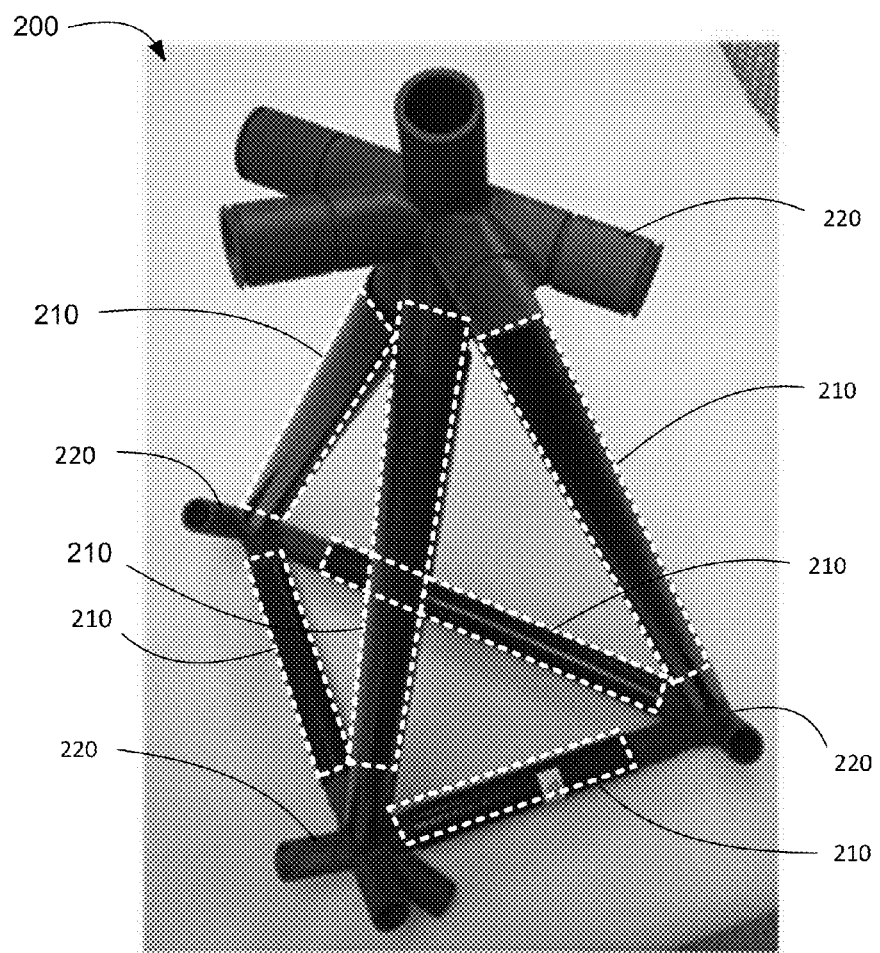
FIG. 2 illustrates a perspective view of an example truss structure according to an implementation.

FIG. 2 illustrates a perspective view of an example truss structure according to an implementation. The structure assembly 200 includes a plurality of strut elements 210, each strut element 210 being mechanically mated with a pair of coupling nodes 220. In some implementations, the strut element 210 may be a thin-walled structural member fabricated, for example, from a carbon composite material such as graphite fiber reinforced polymer (GFRP). As illustrated in FIG. 2, the strut element 210 may be configured as a hollow round tube. Alternatively, the strut element 210 may have a square or rectangular cross-section, for example. The strut element 210 may be configured to include, proximate to each end of the strut element, a respective node mating interface portion.

The coupling nodes 220 may be produced using an additive manufacturing method (e.g., 3-D printing) and may include two or more strut element mating interface portions. As will be described in more detail hereinbelow, the respective mating interface portions of the strut elements 210 and the coupling nodes 220 are configured to enable the structure assembly 200 to be initially roughly assembled by dry fitting of the respective strut elements 210 and coupling nodes 220.

In the roughly assembled condition, the structure assembly 200 may be capable of bearing its own weight, and have an appearance substantially similar to a finished assembly. However, the roughly assembled structure will be less rigid than the finished assembly and may be configured to be flexible enough to permit manual alignment adjustment at a high level of assembly that may include a substantial number of dry fitted joints and represent a substantial portion or the entirety of the structure assembly 200.

Figure 3:
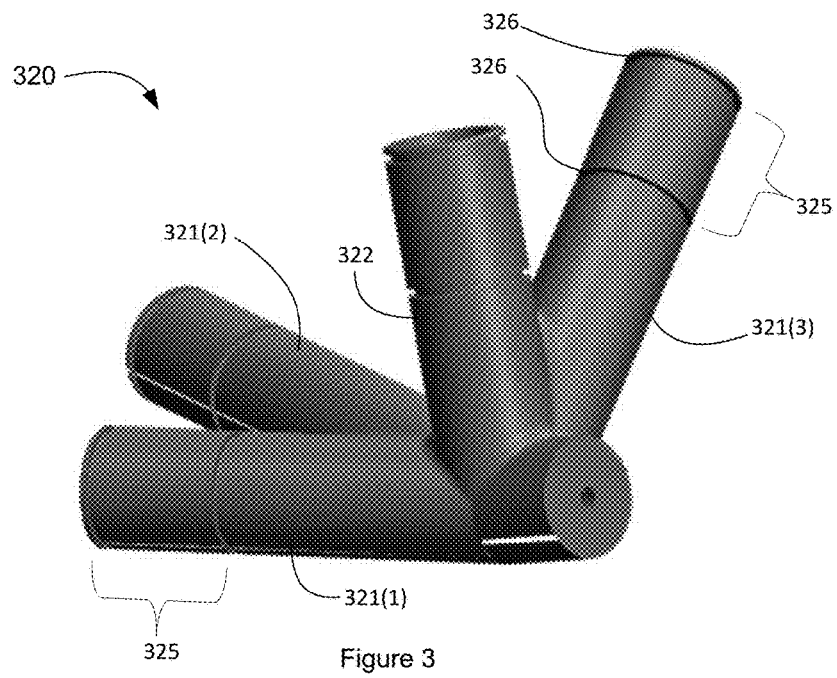
FIG. 3 illustrates a perspective view of a coupling node, according to an implementation.

FIG. 3 illustrates a perspective view of a coupling node 320, according to an implementation. In the illustrated example, the coupling node 320 includes four protrusions (referred to herein as legs) that may each be configured to include a mating interface with a corresponding strut element (not illustrated). In the illustrated example, the coupling node 320 includes one relatively short leg 322, and three relatively long legs, 321(1), 321(2), and 321(3). Each leg includes a strut element mating interface portion 325. In the illustrated example, each strut element mating interface portion 325 includes O-ring grooves 326.

Figure 4:
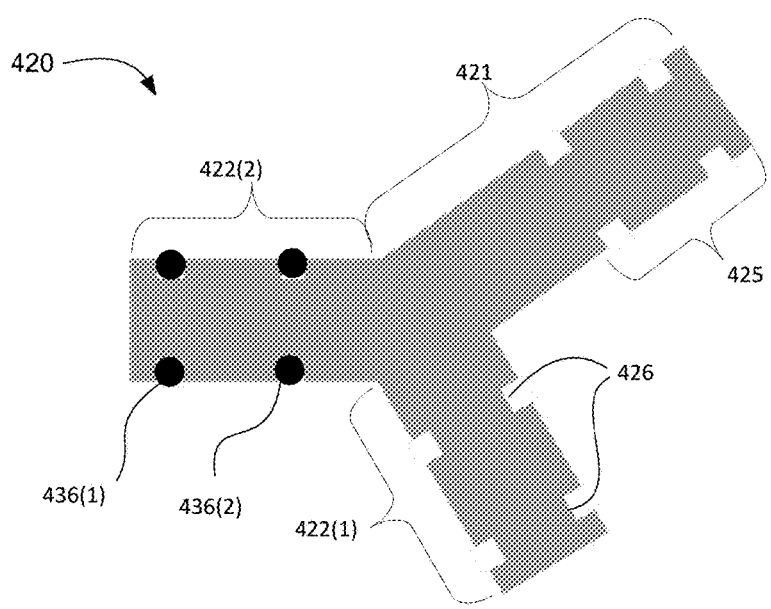
FIG. 4 illustrates a plan view of a coupling node according to another implementation.

FIG. 4 illustrates a plan view of a coupling node 420 according to another implementation. In the illustrated example, the coupling node 420 includes two relatively short legs, 422(1) and 422(2), and one relatively long leg, 421. Each leg includes a strut element mating interface portion 425. In the illustrated example, each strut element mating interface portion 425 includes O-ring grooves 426. O-rings 436(1) and 436(2) are shown as being disposed in O-ring grooves of short leg 422(2).

Figure 5:
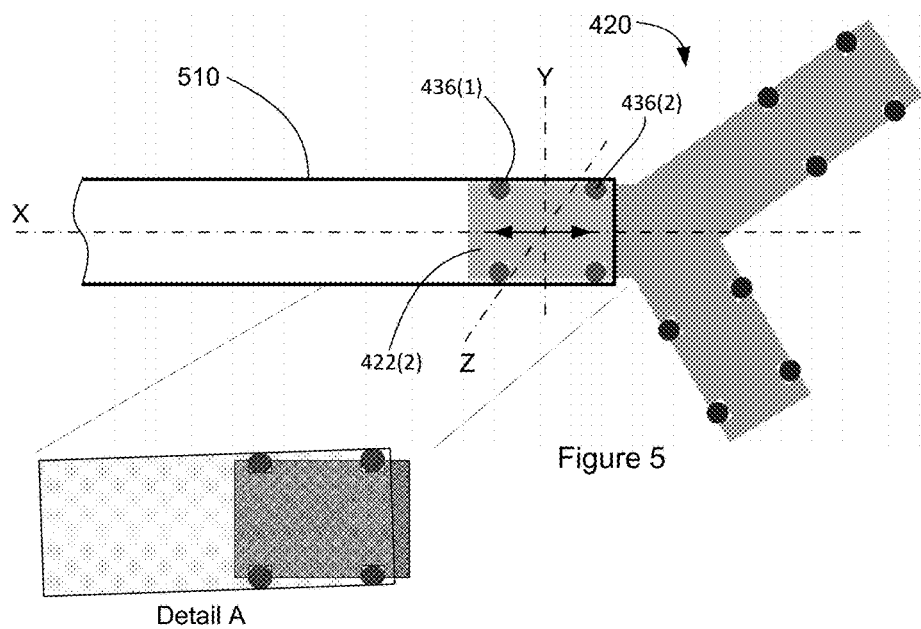
FIG. 5 illustrates a plan view of a dry fit assembly of a first end of a strut element with a coupling node according to an implementation.

FIG. 5 illustrates a plan view of a dry fit assembly of a first end of a strut element 510 with the coupling node 420 according to an implementation. In the illustrated example, an internal mating surface of a first end of strut element 510 has engaged each of O-ring 436(1) and O-ring 436(2). As a result, the internal mating surface is proximal to an external mating surface of the short leg 422(2) and an annular gap is provided between the internal mating surface and the external mating surface.

FIG. 5 includes annotations of a Cartesian coordinate system, wherein an X axis is aligned with a longitudinal axis of the strut element 510 and a mutually orthogonal Y axis and Z axis define a plane transverse to the X axis disposed midway between O-rings 436(1) and O-ring 436(2). In the illustrated dry fit configuration, the strut element 510 is slidably connected with the coupling node 420. As a result, motion of the strut element 510 relative to the coupling node 420 along the X-axis, and rotation of the strut element 510 relative to the coupling node 420 about the X-axis, will encounter little or no resistance other than frictional forces arising between the strut element and the O-rings 436(1) and 436(2). In some implementations, the dry fit configuration also permits a certain amount of flexure about an axis orthogonal to the X axis and in the YZ plane. Referring to Detail A, the illustrated example shows how compression of the O-rings 436(1) and 436(2) and judicious control of a gap spacing between a maximum outside diameter of the coupling node 420 and a minimum internal diameter of the strut element 510 permits the certain amount of flexure.

Figure 6:
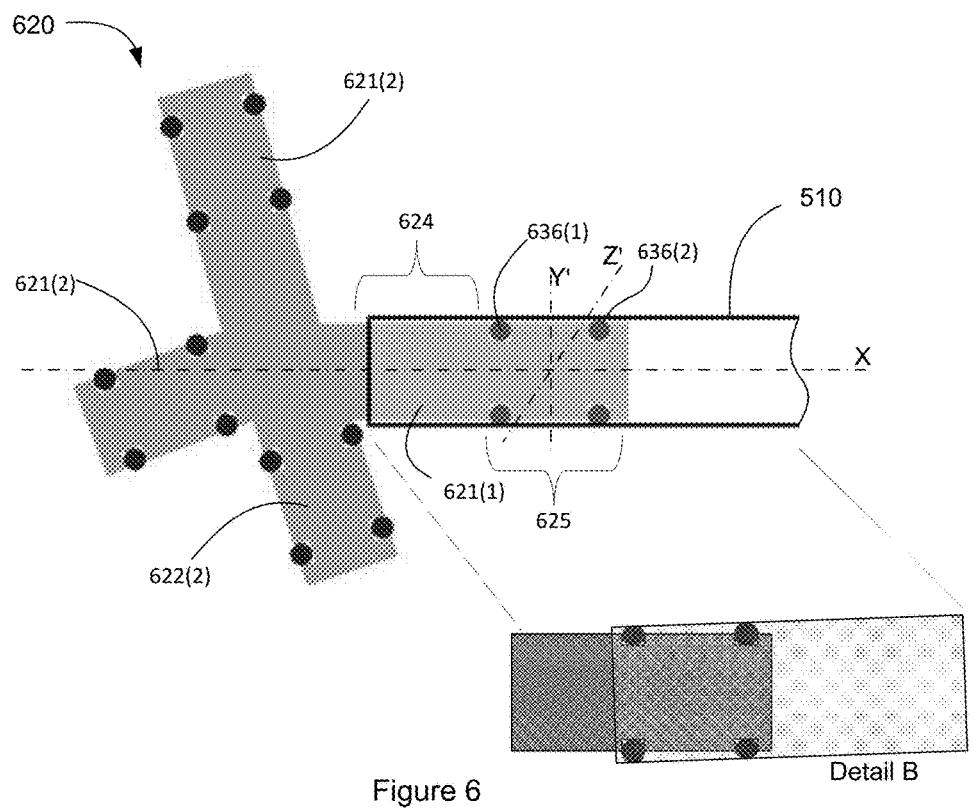
FIG. 6 illustrates a plan view of a dry fit assembly of a second end of a strut element with a long leg of a coupling node, according to an implementation.

FIG. 6 illustrates a plan view of a dry fit assembly of a second end of the strut element 510 with a long leg 621(1) of a coupling node 620, according to an implementation. The long leg 621(1) includes, at a distal portion thereof, a strut element mating interface portion 625 within which O-rings 636(1) and 636(2) are disposed. The long leg 621(1) also includes a proximal portion 624. The proximal portion 624 of the long leg 621(1) may have a length that is approximately equal to or larger than a length of short leg 422(2).

In the illustrated example, an internal mating surface of a second end of strut element 510 has engaged each of O-ring 636(1) and O-ring 636(2). As a result, the internal mating surface is proximal to an external mating surface of the long leg 621(1) and an annular gap is provided between the internal mating surface and the external mating surface. In the illustrated dry fit condition, the internal mating surface of the strut element substantially encompasses both the strut element mating interface portion 625 and the proximal portion 624 of the long leg 621(1).

FIG. 6 includes annotations of a Cartesian coordinate system, wherein an X axis is aligned with a longitudinal axis of the strut element 510 and a mutually orthogonal Y' axis and Z' axis define a plane' transverse to the X axis disposed midway between O-rings 636(1) and O-ring 636(2). In the illustrated dry fit configuration, the strut element 510 is slidably connected with the coupling node 620. As a result, motion of the strut element 510 relative to the coupling node 620 along the X-axis and rotation of the strut element 510 relative to the coupling node 620 about the X-axis will encounter little or no resistance other than frictional forces arising between the strut element and the O-rings 636(1) and 636(2). In some implementations, the dry fit configuration also permits a certain amount of flexure about an axis orthogonal to the X axis and in the Y'Z' plane. Referring to Detail B, the illustrated example shows how compression of the O-rings 636(1) and 636(2) and judicious control of a gap spacing between a maximum outside diameter of the coupling node 620 and a minimum internal diameter of the strut element 510 permits the certain amount of flexure.

Thus, it is contemplated that respective dimensions and material properties of the coupling nodes 420, 620, O-rings 436 and 636, and the strut element 510 may be selected such that strut element 510 has a sliding fit with the O-rings 636 and 436. Desirably, in a dry fitted condition, for strut/node joints of the type illustrated in FIGS. 5 and 6, frictional forces arising from contact between the O-rings and the internal mating surface of the strut element 510 are sufficient to resist gravitational forces and incidental contact, and to yield to a persistently applied manual force. For example, the frictional forces may be such that an applied load in the range of about 5-30 pounds may be necessary to overcome the frictional forces. Thus, a relative position of the strut element and a coupling node along the longitudinal axis of the strut element may be manually adjusted. Likewise, an angular orientation of the coupling node about the longitudinal axis may be manually adjusted. Moreover, as indicated above, the strut/node joints in the dry fitted condition may provide for slight flexural motion around an axis orthogonal to a longitudinal axis of the strut element.

Figure 7:
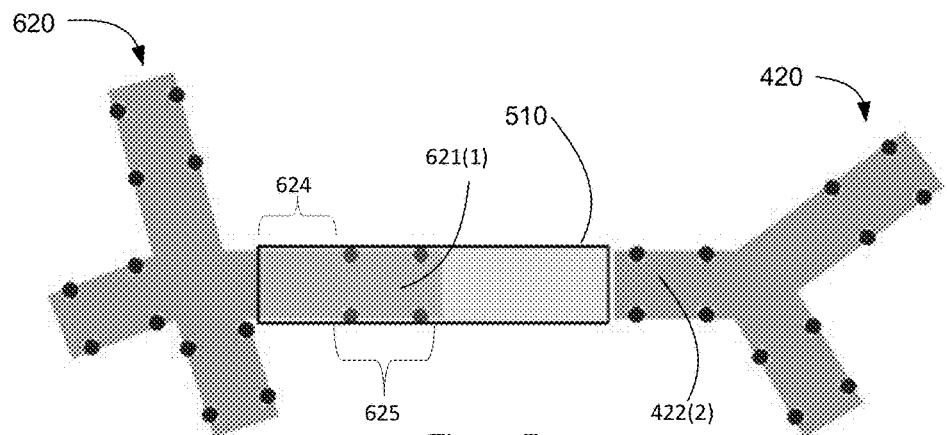
FIG. 7 illustrates a step in an assembly sequence of a strut element with a first and a second coupling node, according to an implementation.
Figure 8:
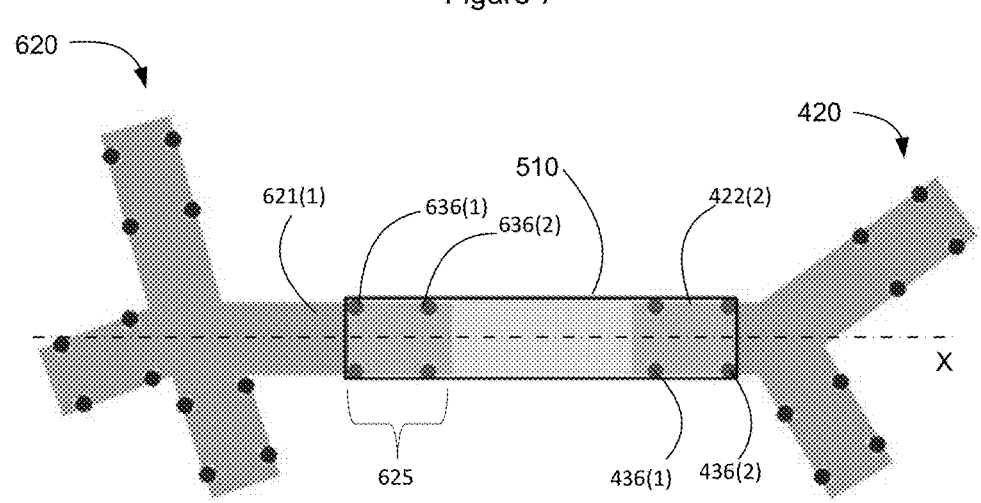
FIG. 8 illustrates another step in an assembly sequence of the strut element with the first and second coupling node, according to an implementation.
Figure 9:
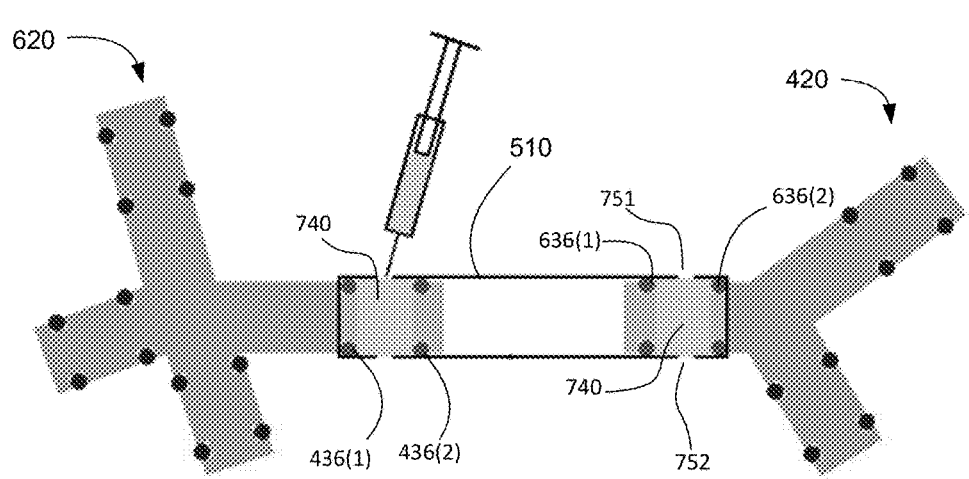
FIG. 9 illustrates a further step in an assembly sequence of the strut element with the first and second coupling node, according to an implementation.

FIGS. 7-9 illustrate an assembly sequence of the strut element 510 with the coupling node 420 and the coupling node 620, according to an implementation. Referring first to FIG. 7, the first end of the strut element 510 is disposed proximate to short leg 422(2) of the coupling node 420. The second end of strut element 510 is shown as being coupled with the long leg 621(1) of the coupling node 620. Similarly to the implementation illustrated in FIG. 6, the internal mating surface of the second end of the strut element 510 substantially encompasses both the strut element mating interface portion 625 and the proximal portion 624 of the long leg 621(1).

Referring now to FIG. 8, the strut element 510 is shown to be translated relative to the coupling node 420 and the coupling node 620 such that an internal mating surface of the first end of strut element 510 has engaged each of O-ring 436(1) and O-ring 436(2). As a result of the translation, the internal mating surface of the second end of the strut element 510 substantially encompasses only the strut element mating interface portion 625 of the long leg 621(1), including both of O-rings 636(1) and 636(2) and excluding the proximal portion 624 of the long leg 621(1). In the configuration illustrated in FIG. 8, the internal mating surface of the first end of the strut element 510 is proximal to an external mating surface of the short leg 422(2) and an annular gap is provided between the internal mating surface and the external mating surface. Moreover, the gap creates a first annular volume extending the length of a distance between O-rings 436(1) and 436(2). Similarly, the internal mating surface of the second end of the strut element 510 is proximal to an external mating surface of the long leg 621(1) and an annular gap is provided between the internal mating surface and the external mating surface. The gap creates a second annular volume extending the length of a distance between O-rings 636(1) one and 636(2).

The assembly illustrated in FIG. 8 may be referred to as a dry fit assembly because motion of the strut element 510 relative to the coupling nodes 420 and 620 along the X-axis and rotation of the strut element 510 relative to the coupling nodes 420 and 620 about the X-axis will encounter little or no resistance other than frictional forces. As a result, a separation distance between the coupling node 620 and the coupling node 420 may be manually adjusted. Similarly, a rotational orientation of each node coupling with about the longitudinal axis of the strut element 510 may be manually adjusted. As described hereinbelow, it is contemplated that a complex truss structure including multiple dry fit assemblies connected together may undergo alignment at the structure assembly level. As a result, sequential alignment of individual dry fit assemblies may be avoided. Advantageously, the dry fit assemblies may be configured to be "self-supporting" by which is meant that frictional forces arising from contact between the O-rings and the internal mating surface of the strut element 510 are sufficient to resist gravitational forces and incidental contact, but insufficient to resist a persistently applied manual force. For example, the frictional forces may be such that an applied load in the range of about 5-30 pounds may be necessary to overcome the frictional forces.

When it is desired to rigidize respective joints (e.g., subsequent to alignment at the structure assembly level), this may be accomplished, in some implementations, without disassembling the dry fitted joints. For example, referring now to FIG. 9, an adhesive 740 may be disposed within the first annular volume and the second annular volume. The adhesive may substantially fill the first annular volume and the second annular volume. In some implementations, adhesive is injected in a liquid state into the first annular volume and the second annular volume, using, for example a syringe, and allowed to cure (harden). Insertion of the adhesive may be facilitated by providing insertion holes 751 through which the adhesive may be inserted and bleed holes 752 from which air displaced by the adhesive may be allowed to escape. In some implementations rigidizing the respective joints may include, in addition or instead of using the above described adhesive technique, installing a mechanical locking device such as a pin or bolt. For example, after forming and aligning the dry fitted joints, mating components may be match drilled and the mechanical locking device installed.

Referring still to FIG. 9, it should be noted that the strut element 510 engages, at a first end with a long leg 621(1) of coupling node 620, and, at a second end, with a short leg 422(2) of coupling node 420. In some implementations, a 3-D truss structure includes a plurality of similarly arranged subassemblies, i.e., each strut element engages at a first end with a long leg of a first coupling node and at a second end with a short leg of a second coupling node. As a result, and as will be explained in more detail below, 3-D truss structures such as those illustrated in FIG. 1 and FIG. 2 may be simply and quickly fabricated.

Figure 10:
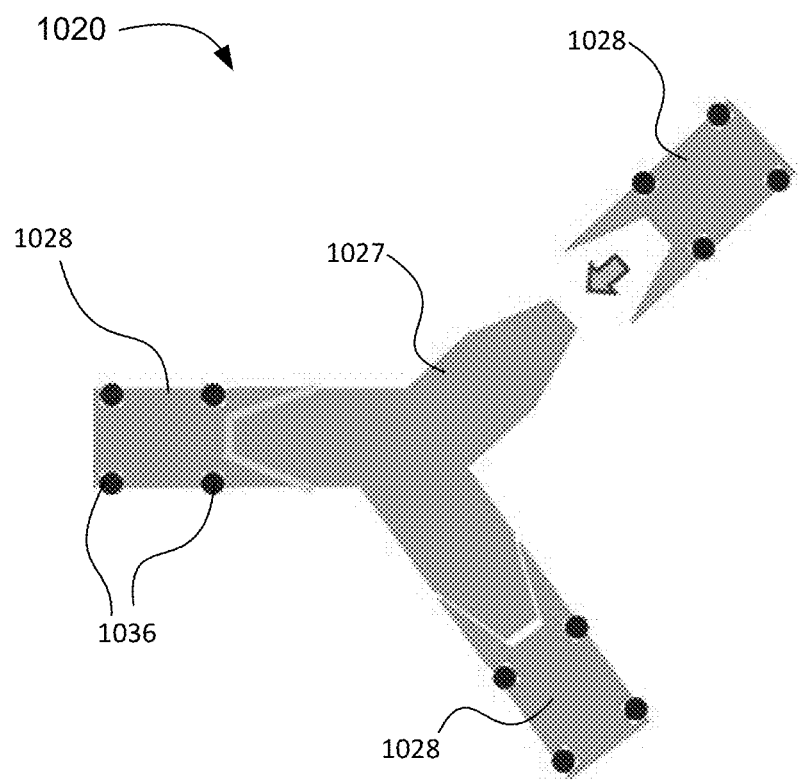
FIG. 10 illustrates a plan view of a coupling node, according to a yet further implementation.

Referring now to FIG. 10, in some implementations a coupling node 1020 may be configured to include a central portion 1027 and a plurality of end fittings 1028. The central portion 1027 may include a plurality of leg stubs, and may be fabricated using a 3-D printing technique. The end fittings 1028 may be precision machined and include grooves for O-rings 1036. The leg stubs and the end fittings may be configured in a "cup and cone" arrangement whereby, for example, a conical recess (cup) in end fitting 1028 is configured to interface with a tapered protrusion (cone) of a leg stub. Each interface between a leg stub and a fitting 1028 may be adhesively bonded and/or threaded, for example. The cup and cone arrangement may be configured to provide a good compressive adhesive bond and be self-aligning. In addition or alternatively, an interface between the leg stub and the fitting may be precision machined, threaded interface.

Figure 11:
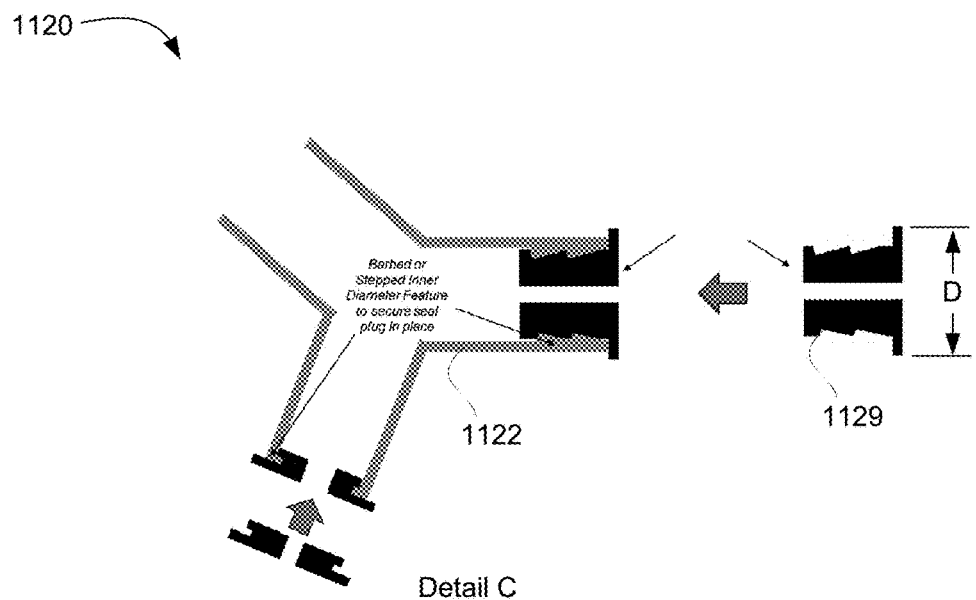
FIG. 11 illustrates a technique for forming a joint of a coupling node and a strut element, according to another implementation.
Figure 11:
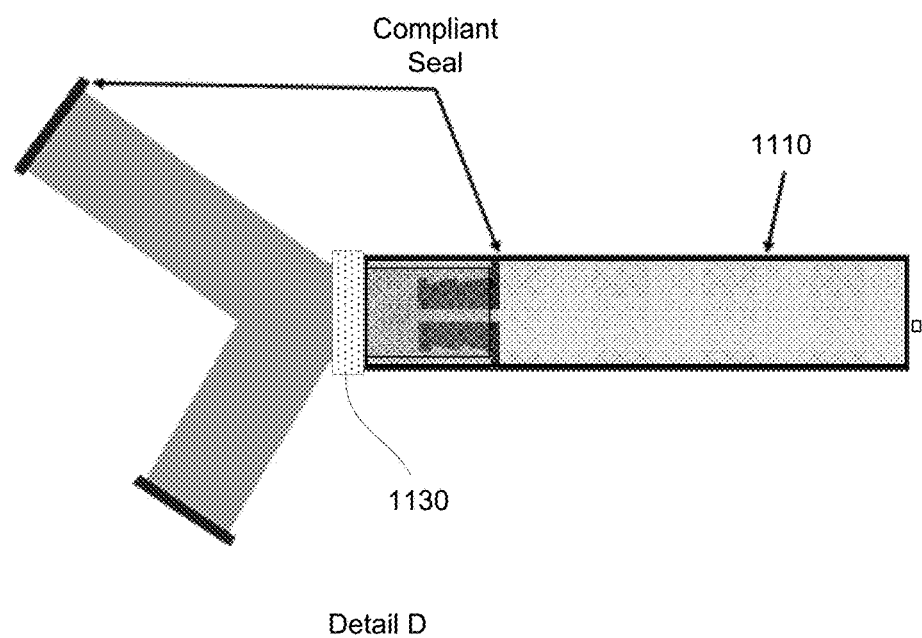

Referring now to FIG. 11, in some implementations strut/node joints may omit O-rings. For example, referring to Detail C of FIG. 11, an elastomeric insert (or "seal plug") 1129 may be press fit or otherwise fastened in a distal portion of a leg 1122 of coupling node element 1120 so as to provide a compliant seal having an outer edge surface with an exterior dimension 'D' selected such that the outer edge surface engages with an internal mating surface of a strut element. Advantageously, dimensions and material properties of the compliant seal may be selected such that dry fitted assemblies are self-supporting, i.e., that frictional forces arising from contact between the compliant seal and the internal mating surface of the strut element are sufficient to resist gravitational forces and incidental contact, but insufficient to resist a persistently applied manual force. For example, the frictional forces may be such that an applied load in the range of about 5-30 pounds may be necessary to overcome the frictional forces.

The resulting joint may be rigidized by inserting an adhesive. For example, referring now to Detail D, an adhesive may be disposed within an annular volume defined by a gap distance between an outer surface of the lake 1122 and an inner surface of a strut element 1110. The adhesive may substantially fill the annular volume. In some implementations, adhesive is injected in a liquid state into the first annular volume and the second annular volume, using, for example a syringe, and allowed to cure (harden). In some implementations, an external seal 1130 may be disposed proximate to an end facing surface of the strut element. The external seal may include, for example, shrink tape, adhesive tape, rubber tubing, or sealant tape.

Figure 12A:
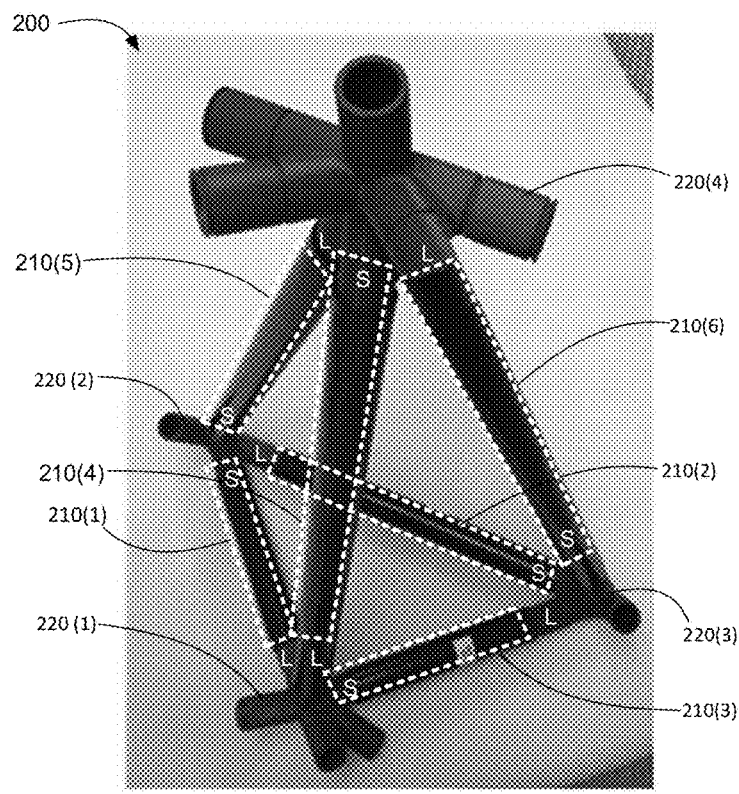
FIGS. 12A-12H illustrate an assembly technique for a 3-D truss structure, according to an implementation.

An example of an assembly technique for a 3-D truss structure will now be described with reference to FIGS. 12A-12H. In FIG. 12A an illustration of the example 3-D truss structure 200 that was previously described in connection with FIG. 2 is further annotated. The truss structure 200 includes six strut elements 210 and four coupling nodes 220. Such a structure may be referred to as a "closed" truss structure because each coupling node is coupled with at least two strut elements. Each strut element 210 engages at a first end with a long ("L") leg of a first coupling node 220 and at a second end with a short ("S") leg of a second coupling node 220. For example, strut element 210(1) engages with a short leg of coupling node 220(2) and with a long leg of coupling node 220(1). Similarly, strut element 210(2) engages with a short leg of coupling node 220(3) and with a long leg of coupling node 220(2); strut element 210(3) engages with a short leg of coupling node 220(1) and with a long leg of coupling node 220(3); strut element 210(4) engages with a long leg of coupling node 220(1) and with a short leg of coupling node 220(4); strut element 210(5) engages with a short leg of coupling node 220(2) and with a long leg of coupling node 220(4); and strut element 210(6) engages with a short leg of coupling node 220(3) and with a long leg of coupling node 220(4).

As described above, each long leg of each coupling node may include a distal portion and a proximal portion, the distal portion including a strut element mating interface portion within which one or more elastomeric seals, such as the O-rings and elastomeric inserts described above, may be disposed. The proximal portion of a long leg may have a length that is approximately equal to or larger than a length of a corresponding short leg.

Figure 12B:
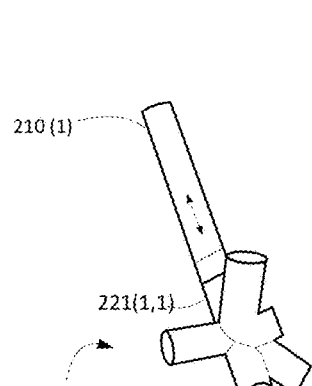
Figure 12C:
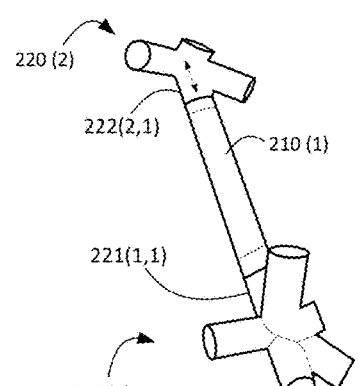

An example of a dry fit assembly sequence of the structure 200 will now be described. Referring first to FIG. 12B, a first end of the strut element 210(1) may be slidably engaged with a distal portion of a first long leg 221(1,1) of the coupling node 220(1). Referring to FIG. 12C, a first short leg 222(2,1) of coupling node 220(2) may be slidably engaged with a second end of the strut element 210(1).

Figure 12D:
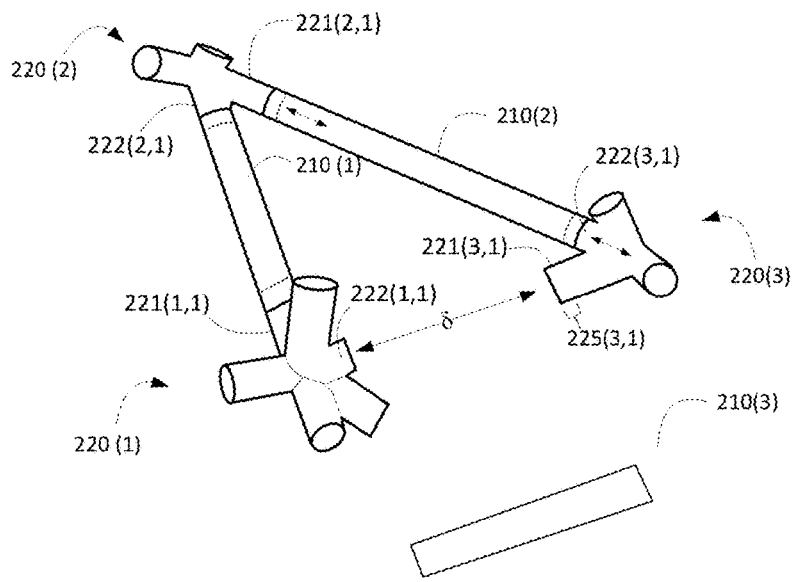

Referring now to FIG. 12D, a first end of the strut element 210(2) may be slidably engaged with a strut element mating interface portion of a first long leg 221(2,1) of the coupling node 220(2). A first short leg 222(3,1) of coupling node 220(3) may be slidably engaged with a second end of the strut element 210(2).

As a result of the foregoing steps, a substantially planar V-shaped assembly has been formed. Angular orientation of each of the coupling nodes 220(1) and 220(3) may be manually adjusted by rotation of the coupling node about a longitudinal axis of a respective strut element. More particularly, the coupling node 220(1) may be rotated about a longitudinal axis of strut element 210(1) and the coupling node 220(3) may be rotated about a longitudinal axis of strut element 210 (2). As a result, a first long leg 221(3,1) of coupling node 220(3) may be manually aligned to face a first short leg 222(1,1) of coupling node 220(1). The strut element 210(3) may be sized so as to mechanically couple the first long leg 221(3,1) of coupling node 220(3) and the first short leg 222(1,1) of coupling node 220(1). More specifically, in some implementations, the strut element 210(3) may be configured to have a length that slightly exceeds a first distance δ between facing ends of the first long leg 221(3,1) of coupling node 220(3) and the first short leg 222(1,1) of coupling node 220(1). More particularly still, the length may be approximately the sum of the first distance δ and two times the length of a strut element mating interface portion 225(3,1) of the first long leg 221(3,1) of coupling node 220(3).

Fabrication of the dry fit assembly may continue with engaging a first end of the strut element 210(3) with the first long leg 221(3,1) of the coupling node 220(3). This step may be facilitated by rotating coupling node 220(3) about the longitudinal axis of strut element 210(2) such that the first long leg 221(3,1) of the coupling node 220(3) is oriented slightly out of the plane of the V-shaped assembly. The first end of the strut assembly 210(3) may be slidably engaged with the first long leg 221(3,1) of the coupling node 220(3) such that an internal mating surface of the first end of the strut assembly 210(3) substantially encompasses both the strut element mating interface portion 225(3,1) and a substantial portion of the first long leg 221(3,1) outside the strut element mating interface portion 225(3,1). The coupling node 220(3) may then be rotated about the longitudinal axis of strut element 210(2) such that the strut element 220(3) is oriented in the plane of the V-shaped assembly and such that a second end of the strut element 210(3) is proximal to the first short leg 222(1,1) of the coupling element 220(1). Then, the strut element 210(3) may be slidably engaged with the first short leg 222(1,1) of the coupling element 220(1) by translating the strut element 210(3) along its longitudinal axis such that it encompasses only the strut element mating interface portion of the first long leg of the coupling node 220(3). As a result, a first triangular substantially planar subassembly has been formed (FIG. 12E).

Figure 12E:
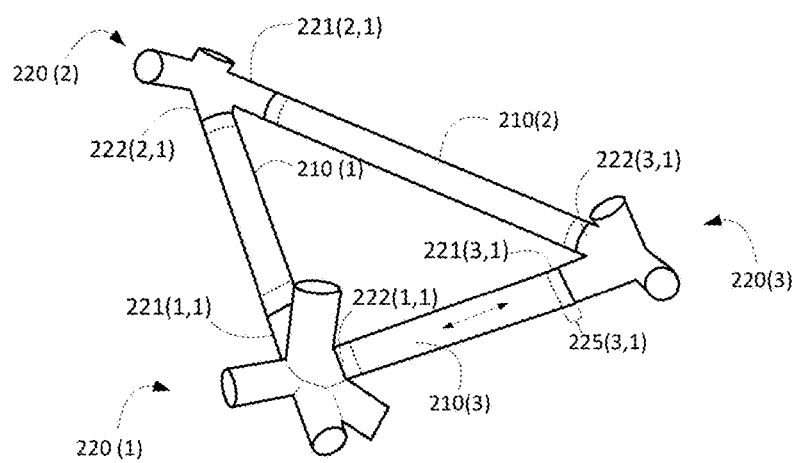

It will be appreciated that the assembly sequence described above is merely illustrative and that the sub assembly illustrated in FIG. 12E may be arrived at by several alternative sequences. For example, in some implementations, prior to engaging short leg 222(3,1) of coupling node 220(3) with the second end of the strut element 210(2), the first long leg 221(3,1) of the coupling node 220(3) may be engaged with the strut element 210(3). More particularly, the first end of the strut assembly 210(3) may be slidably engaged with the first long leg 221(3,1) of the coupling node 220(3) such that the internal mating surface of the first end of the strut assembly 210(3) substantially encompasses both the strut element mating interface portion 225(3,1) and the substantial portion of the first long leg 221(3,1) outside the strut element mating interface portion 225(3,1). Then, a resulting subassembly of coupling node 220(3) and strut element 210(3) may be coupled with strut element 210(2). More particularly, the short leg 222(3,1) may be slidably engaged with the second end of strut assembly 210(2). Then, the strut element 210(3) may be slidably engaged with the first short leg 222(1,1) of the coupling element 220(1) by translating the strut element 210(3) along its longitudinal axis such that it encompasses only the strut element mating interface portion of the first long leg of the coupling node 220(3).

Figure 12F:
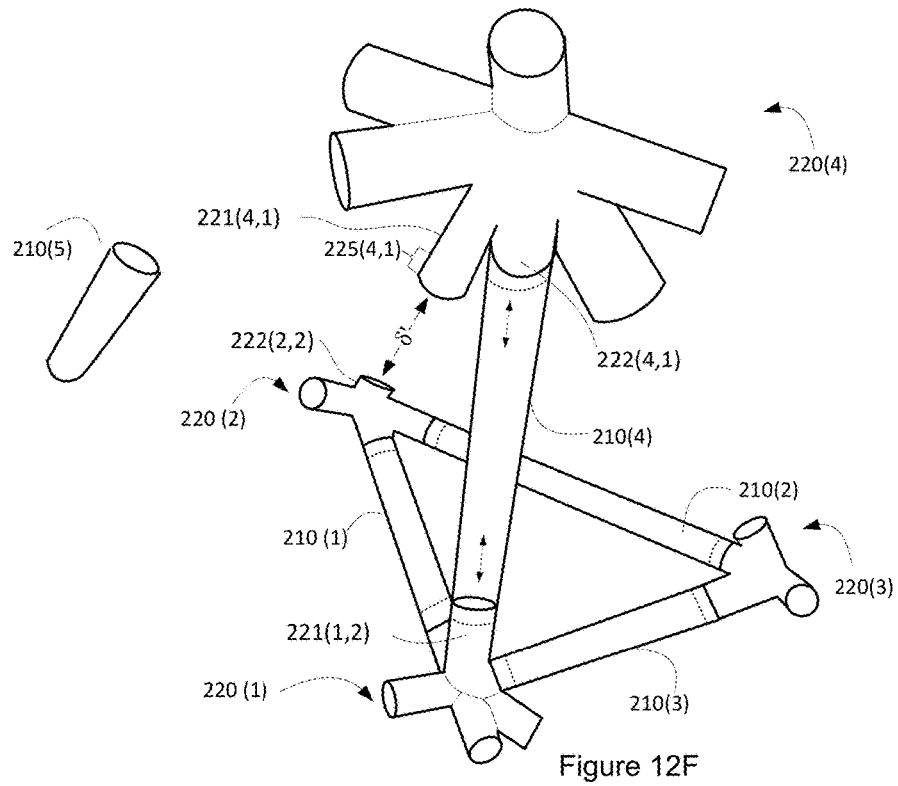

Referring now to FIG. 12F, fabrication of the dry fit assembly may continue with engaging a first end of the strut element 210(4) with a second long leg 221(1,2) of the coupling node 220(1). The first end of the strut element 210(4) may be slidably engaged with the second long leg 221(1,2) of the coupling node 220(1). A first short leg 222(4,1) of coupling node 220(4) may be slidably engaged with a second end of the strut element 210(4).

As a result of the foregoing steps, a second substantially planar V-shaped assembly has been formed that includes the coupling node 220(4), the strut element 210(4), the coupling node 220(1) and the strut element 210(1). A first long leg 221(4,1) of coupling node 220(4) may be manually aligned to face a second short leg 222(2,2) of coupling node 220(2). The strut element 210(5) may be sized so as to mechanically couple the first long leg 221(4,1) of coupling node 220(4) and the second short leg 222(2,2) of coupling node 220(2). More specifically, in some implementations, the strut element 210(5) may have a length that slightly exceeds a second distance δ' between facing ends of the first long leg 221(4,1) of the coupling node 220(4) and the second short leg 222(2,2) of the coupling node 220(2). More particularly still, the length may be approximately the sum of the second distance δ' and two times the length of a strut element mating interface portion 225(4,1) of the first long leg 221(4,1) of the coupling node 220(4).

Fabrication of the dry fit assembly may continue with engaging a first end of the strut element 210(5) with the first long leg 221(4,1) of the coupling node 220(4). This step may be facilitated by rotating coupling node 220(4) about a longitudinal axis of strut element 210(4) such that the second long leg of the coupling node 220(4) is oriented slightly out of the plane of the second V-shaped assembly of the strut element 210(4), the coupling node 220(1) and the strut element 210(1). The first end of the strut assembly 210(5) may be slidably engaged with the first long leg 221(4,1) of the coupling node 220(4) such that an internal mating surface of the first end of the strut assembly 210(5) substantially encompasses both the strut element mating interface portion 225(4,1) and a substantial portion of the second long leg 221(4,1) of the coupling node 220(4) outside the strut element mating interface portion 225(3,1).

The coupling node 220(4) may be rotated about the longitudinal axis of strut element 210(4) such that a second end of the strut element 210(5) is proximal to the second short leg 222(2,2) of the coupling element 220(2). As a result, the strut element 210(5) may be slidably engaged with the second short leg 222(2,2) of the coupling element 220(2) by translating the strut element 210(5) along its longitudinal axis such that it encompasses only the strut element mating interface portion 225(4,1) of the second long leg 221(4,1) of the coupling node 220(4). As a result, a second substantially planar triangular subassembly has been formed as illustrated in FIG. 12G, the first and second triangular subassemblies sharing the strut element 210(1) and the coupling nodes 220(1) and 220(2) and including nine dry fitted joints.

Figure 12G:
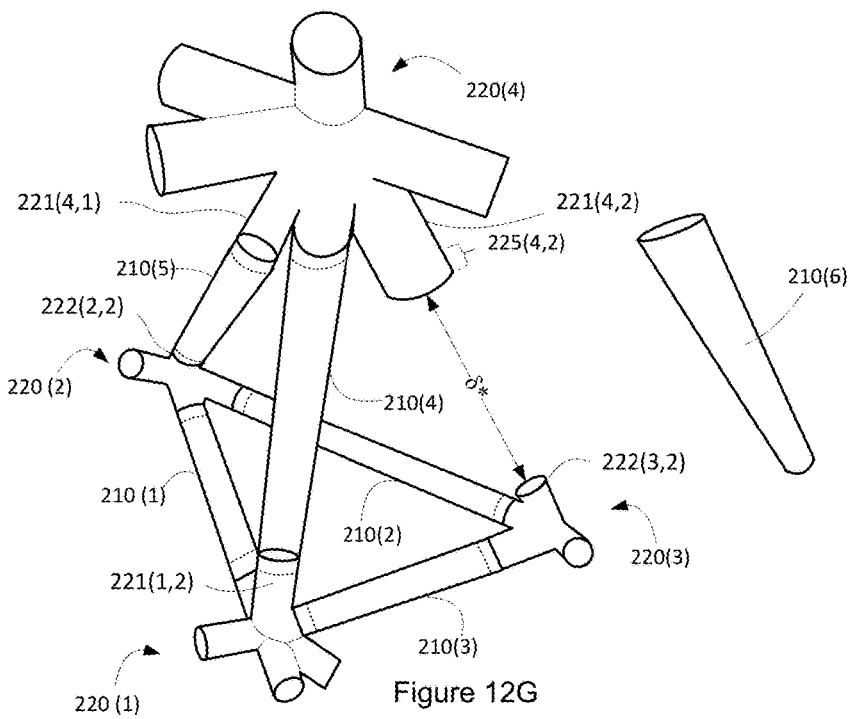

Referring still to FIG. 12G, the coupling node 220(4) may be configured such that a second long leg 221(4,2) of the coupling node 220(4) is aligned to face a second short leg 222(3,2) of coupling node 220(3). Strut element 210(6) may be sized so as to mechanically couple the third long leg 221(4,2) of coupling node 220(4) and the second short leg 222(3,2) of coupling node 220(3). More specifically, in some implementations, the strut element 210(6) may have a length that slightly exceeds a third distance δ* between facing ends of the second long leg 222(4,2) of coupling node 220(4) and the second short leg 222(3,2) of coupling node 220(3). More particularly still, the length may be approximately the sum of the third distance δ* and two times the length of a strut element mating interface portion 225(4,2) of the second long leg 221(4,2) of coupling node 220(4).

Fabrication of the dry fit assembly may continue with engaging a first end of the strut element 210(6) with the second long leg 221(4,2) of the coupling node 220(4). This step may be facilitated by flexing the second triangular subassembly with respect to the first triangular subassembly about an axis defined by the longitudinal axis of strut element 210(1). The first end of the strut assembly 210(6) may be slidably engaged with the second long leg 221(4,2) of the coupling node 220(4) such that an internal mating surface of the first end of the strut assembly 210(6) substantially encompasses both a strut element mating interface portion 225(4,2) and a substantial portion of the second long leg 221(4,2) of the coupling node 220(4) outside the strut element mating interface portion 225(4,2).

A reversal of the flexing of the second triangular subassembly with respect to the first triangular subassembly may bring a second end of the strut element 210(6) into proximity with the second short leg 222(3,2) of the coupling 220(3). As a result, the strut element 210(6) may be slidably engaged with the second short leg 222(3,2) of the coupling element 220(3) by translating the strut element 210(6) along its longitudinal axis such that it encompasses only the strut element mating interface portion 225(4,2) of the third long leg of the coupling node 220(4). As a result, a dry fitted truss assembly has been formed (FIG. 12H).

Figure 12H:
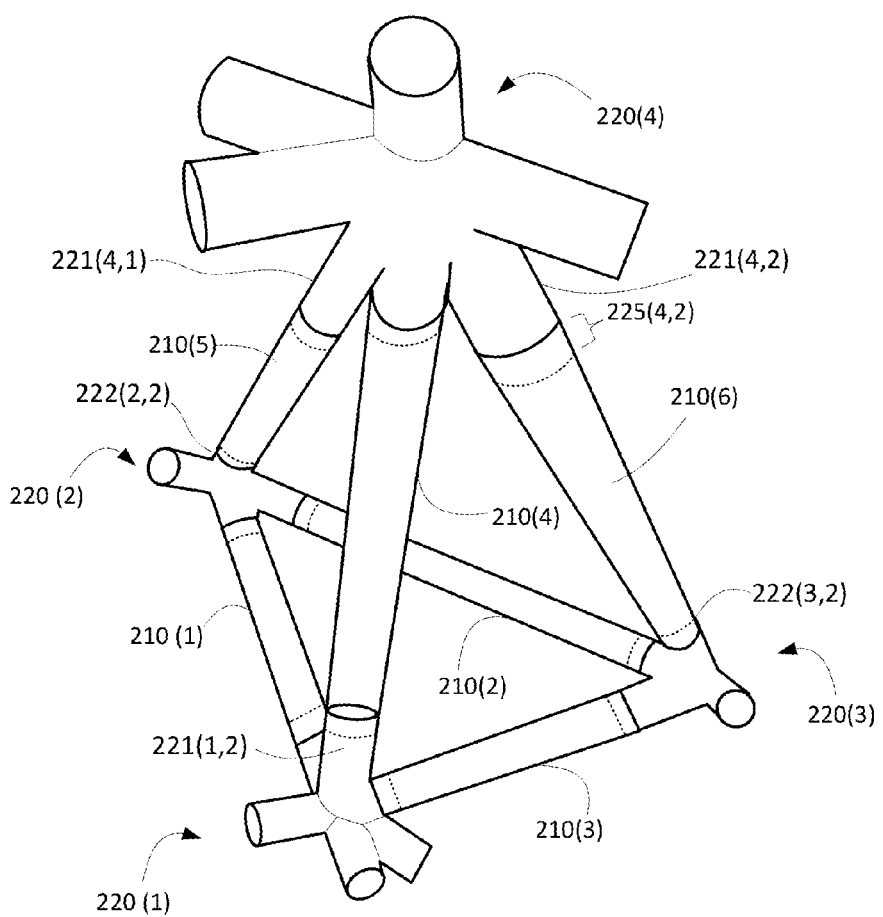

It will be appreciated that the assembly sequence described above is merely illustrative and that the sub assembly illustrated in FIG. 12H may be arrived at by several alternative sequences. For example, in some implementations, starting with the configuration illustrated in FIG. 12 F a first end of strut element 210(5) and a first end of strut element 210(6) may be engaged with respective long legs 225(4,1) and 225(4,2). This step may be facilitated by rotating coupling node 220(4) about the longitudinal axis of strut element 210(4) such that the long legs 225(4,1) and 225(4,2) are not aligned, respectively, with the short legs 222(2,2) and 222(3,2). Each of the strut elements 210(5) and 210(6) may be slidably engaged with respective long legs of the strut element 210(4) so as to substantially encompass respective strut element mating interface portions and a substantial portion of the respective long legs of the coupling node 220(4) outside the strut element mating interface portions.

Then the coupling node 220(4) may be rotated about the longitudinal axis of strut element 210(4) such that respective second ends of the strut elements 210(5) and 210(6) are proximal to respective second short legs of the coupling element 220(2) and 220(3). Then, the strut elements may be slidably engaged with the respective second short legs by translating the strut elements along their respective longitudinal axes. As a result each of strut element 210(5) and 210 (6) may encompass only the strut element mating interface portions of respective long legs of the coupling node 220(4). As a result, the dry fitted truss assembly illustrated in FIG. 12 G may be formed while avoiding flexure of strut/node joints outside a plane of the strut axis.

Figure 13A:
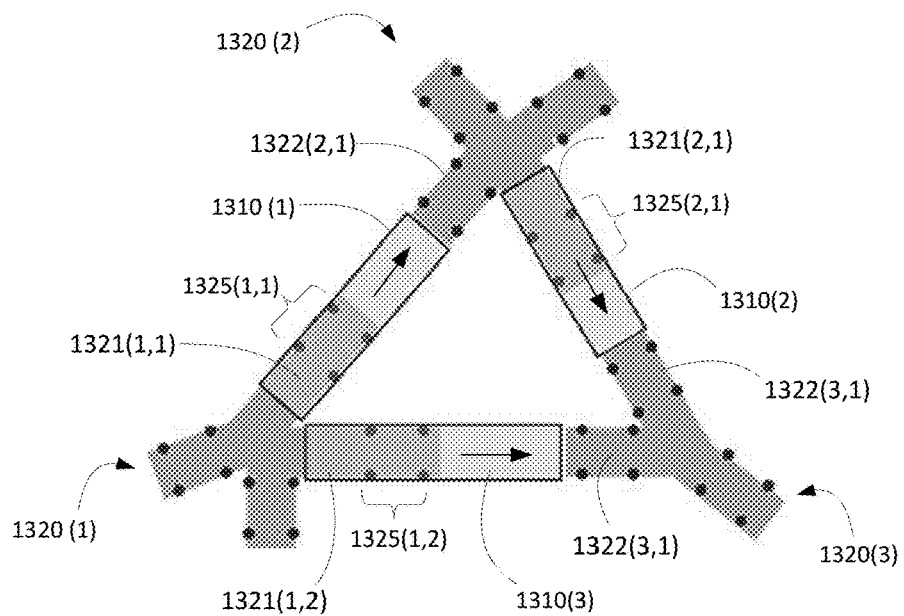
FIGS. 13A and 13B illustrate a further example of an assembly sequence of a portion of a 3-D truss structure, according to an implementation.
Figure 13B:
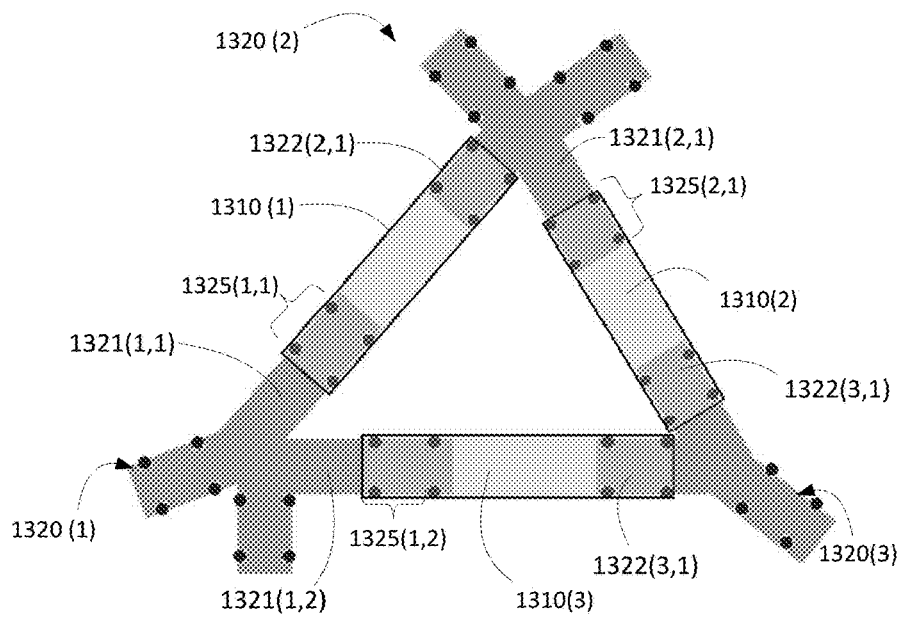

Referring now to FIGS. 13A and 13B, a further example of an assembly sequence will be described. In the arrangement illustrated in FIG. 13A, three subassemblies, each subassembly including a strut element 1310 and a coupling node 1320 have been mutually aligned such that an axis of a respective strut element 1310 is approximately coaxial with an axis of a leg of an adjoining coupling node. For example strut element 1310(1) which has been coupled with long leg 1321(1,1) of coupling no 1320(1) is aligned with a short leg 1322(2,1) of coupling node 1320(2). It should be noted that, in FIG. 13A, each strut element 1310 is disposed so as to encompass both a respective strut element mating interface portion 1325 and a substantial portion of a respective long leg 1321 outside the strut element mating interface portion 225(3,1). By translating each strut element 1310 in the respective indicated direction, the arrangement illustrated in FIG. 13B may be obtained, wherein each strut element 1310 is coupled, at a first end, with a long leg 1321 of a first coupling node 1320 and, at a second end, with a short leg 1322 of a second coupling node. It will be appreciated that the arrangement illustrated in FIG. 13B may be obtained from the arrangement illustrated in FIG. 13A by simply translating the respective strut elements without a necessity to rotate any strut element with respect to a coupling node.

Using a similar technique to the above described sequence, a 3-D closed form polyhedral truss structures such as the one illustrated in FIG. 12H may be obtained without a necessity to rotate or flex any strut/node joint.

Figure 14:
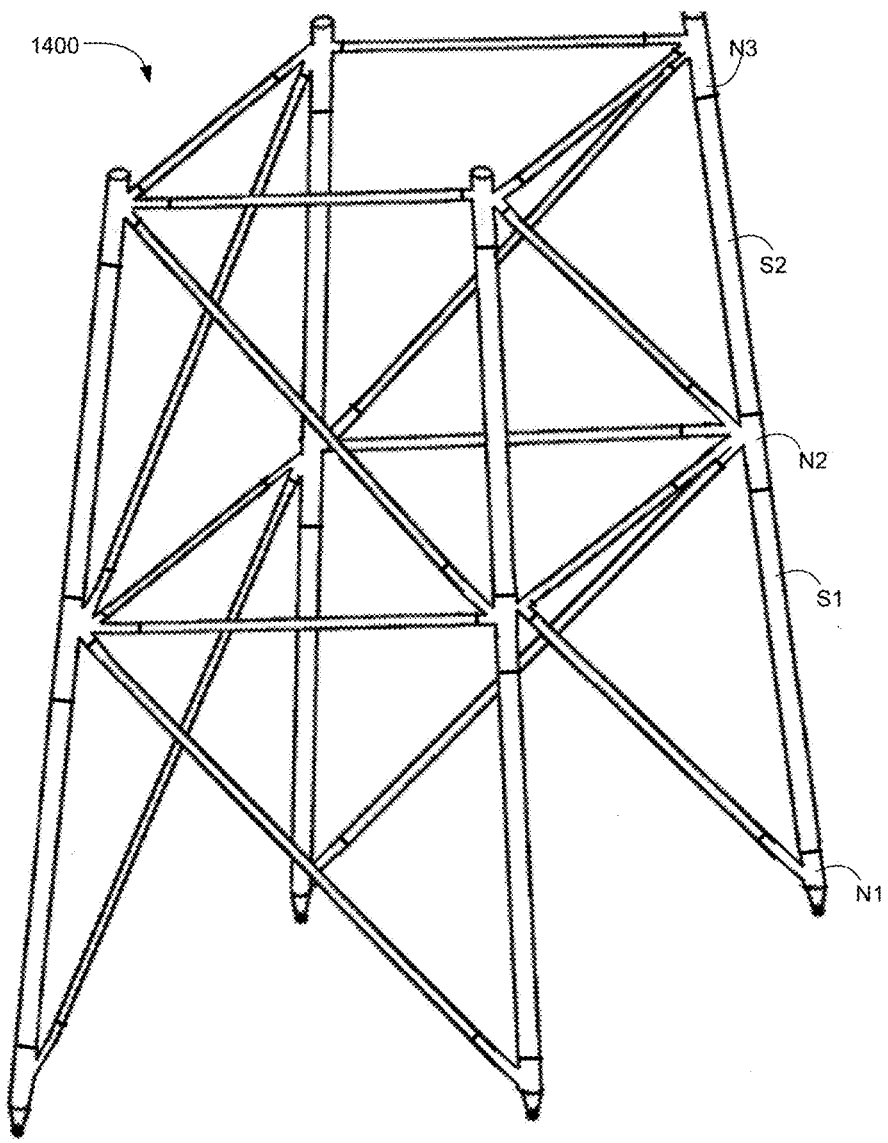
FIG. 14 illustrates a further example of a 3-D truss structure, according to an implementation.

FIG. 14 illustrates a further example of a 3-D truss structure, assembled using the presently disclosed techniques. The structure 1400 includes 24 strut elements and 12 coupling nodes. It will be appreciated that a coupling node may be mated with any number of strut elements (in the illustrated implementation, as few as two (e.g., node N1) and as many as six (e.g., node N2)) but that each strut element may be mated only with exactly two coupling nodes. More particularly, as disclosed above, each strut element may have a first end mated with a short leg of one of the two coupling nodes and a second end mated with a long leg of the other of the two coupling nodes. For example, referring still to FIG. 14, it may be observed that a lower end of strut element S1 is mated to a short leg of coupling node N1, whereas an upper end of strut element S1 is mated to a long leg of coupling node N2. Similarly a lower end of strut element S2 is mated to a short leg of coupling node N2, whereas an upper end of strut element S2 is mated to a long leg of coupling node N3.

The presently disclosed techniques permit a truss structure of the sort illustrated in FIG. 14, as well as truss structures that are asymmetric and substantially more complex than the illustrated example, to be fabricated efficiently. Because the dry fit assembly is self-supporting and yet capable of manual adjustment for alignment purposes, the strut elements and coupling joints may be rigidized only when desired, for example after final alignment at the structure assembly level.

Figure 15:
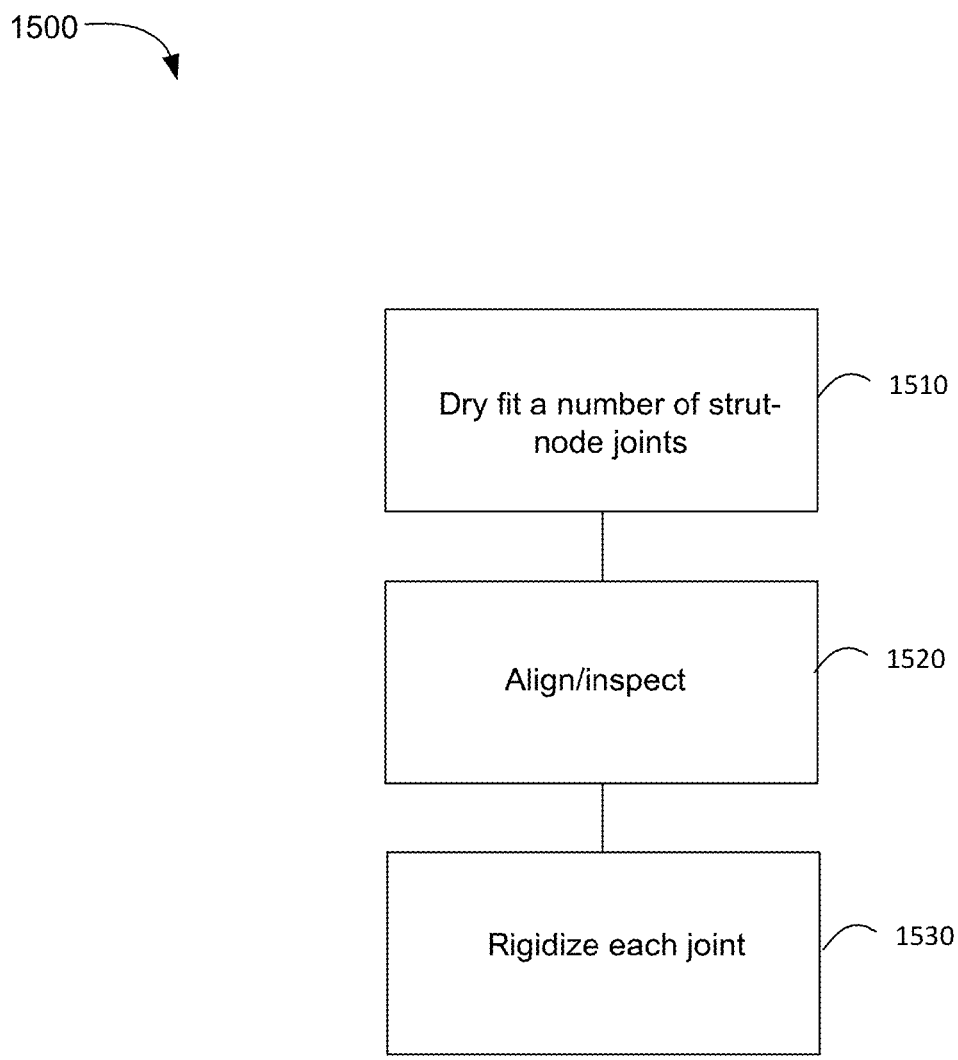
FIG. 15 illustrates a method of fabricating a 3-D truss structure, according to an implementation.

Referring now to FIG. 15, a method 1500 of fabricating 3-D truss structure will be described. As discussed hereinabove, the truss-like structure may include any number of strut elements and coupling nodes connected by strut/node joints. Each strut element may be disposed between and attached with a respective pair of the coupling nodes. The method may start at block 1510 with dry fitting a number of strut/node joints. The resulting assembly may be referred to as a dry fit assembly of the plurality of coupling nodes and the plurality of strut elements.

Method may continue at block 1520 with aligning and inspecting the dry fit assembly. The aligning may include manual adjustments of respective locations and orientations of the dry fitted joints.

The method may finish at block 1530 with rigidizing each joint. In some implementations, rigidizing each joint includes affixing each joint with an adhesive. Advantageously, disassembly of any of the dry fitted joints may be avoided.

The above-described techniques enable significant reductions of the processing time and cost of fabricating truss-like structures, particularly structures intended to meet the requirements of a spacecraft application for which achieving high stiffness, tight alignment tolerances and low coefficient of thermal expansion with a low mass structure is highly desired. For example, the present inventors have found that a structure fabricated using the presently disclosed techniques may have a stiffness corresponding to a first resonance frequency of 20 Hz or higher and an alignment accuracy of better than 0.01 inches or 0.05 degrees, notwithstanding that the structure may be 100 ft.$^3$ or greater in volume and include ten or more nodes. These advantages may be obtained by (1) forming a dry fit assembly of the structure, the dry fit assembly being self-supporting and yet capable of manual adjustment for alignment purposes, (2) performing alignment on the dry fit assembly as a whole, prior to rigidizing the joints; and (3) rigidizing the joints without disassembling the joints.

In order to provide a better understanding of the invention, example implementations have been described and illustrated hereinabove. However, many variations with respect to the specifically described implementations are possible.

For example, the implementations disclosed above contemplate that legs of the coupling nodes have a smaller outer diameter than an inner diameter of a mating strut element and that O-rings are disposed within slots provided on the legs of the coupling nodes. It is within the contemplation of the present disclosure that legs of the coupling nodes have a larger inner diameter than an outer diameter of a mating strut element and that O-rings are disposed within slots provided on the strut elements.

Thus, an improved truss-like structure has been disclosed. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A spacecraft comprising:
a 3-D closed truss structure including at least four coupling nodes and at least six strut elements, attached together by a plurality of joints, each coupling node including at least two legs, each strut element disposed between and attached with a respective pair of the plurality of coupling nodes, each joint including adhesive disposed in an annular volume between a mating surface of a respective coupling node and a mating surface of a respective strut element; wherein
the joint is configured to be assembled by (1) forming a dry fitted joint, prior to disposing the adhesive, the dry fitted joint configured to resist gravitational forces and incidental contact, and to permit alignment of the dry fitted joint by yielding to a persistently applied force in the range of about 5-30 pounds and (2) disposing the adhesive in the annular volume without disassembling the dry fitted joint;
each coupling node is attached, at respective ones of the plurality of joints, with at least two strut elements; and
each strut element is attached at a first end with a first leg of a first coupling node and is attached at a second end with a second leg of a second coupling node, the first leg being substantially longer than the second leg.

2. The spacecraft of claim 1, wherein the truss structure is configured to be fabricated by:
forming a dry fit assembly of the plurality of coupling nodes and the plurality of strut elements, the dry fit assembly being self-supporting;
aligning the dry fit assembly; and
rigidizing each joint.

3. The spacecraft of claim 2, wherein rigidizing each joint includes affixing each joint with an adhesive.

4. The spacecraft of claim 2, wherein rigidizing each joint includes injecting an adhesive between mating surfaces of a respective coupling node and strut element and allowing the adhesive to cure.

5. The spacecraft of claim 1, wherein at least one of the plurality of strut elements is a thin-walled structural member fabricated from a carbon composite material.

6. The spacecraft of claim 1, wherein at least one of the plurality of coupling nodes is produced using an additive manufacturing method.

7. The spacecraft of claim 1, wherein each joint includes one or both of an O-ring and an elastomeric insert.

8. The spacecraft of claim 1, wherein each joint includes a coupling node, a strut element and at least one O-ring, and the strut element has a sliding fit with respect to the respective coupling node and the least one O-ring.

9. The spacecraft of claim 1, wherein each joint includes a coupling node, a strut element and at least one elastomeric insert, the elastic insert including a compliant seal having an outer edge surface configured to engage with an internal mating surface of a strut element.

10. The spacecraft of claim 9, wherein each joint includes an external seal disposed proximate to an end facing surface of the strut element.

11. The spacecraft of claim 1, wherein an outer diameter of a leg of at least one coupling node is less than an inner diameter of a mating strut element.

12. The spacecraft of claim 1, wherein the truss structure:
includes at least ten coupling nodes;
is at least 100 ft.$^3$ in volume;
has a stiffness corresponding to a first resonance frequency of 20 Hz or higher; and
has an alignment accuracy of better than 0.01 inches or 0.05 degrees.

13. A structure comprising:
a plurality of coupling nodes; and
a plurality of strut elements, each strut element disposed between and attached with a respective pair of the plurality of coupling nodes; wherein
the structure is a 3-D closed truss structure including at least four coupling nodes and at least six strut elements connected at a plurality of joints, wherein each coupling node is attached with at least two strut elements, each joint including adhesive disposed in an annular volume between a mating surface of a respective coupling node and a mating surface of a respective strut element; and
the joint is configured to be assembled by (1) forming dry fitted joint, prior to disposing the adhesive, the dry fitted joint configured to resist gravitational forces and incidental contact, and to permit alignment of the dry fitted joint by yielding to a persistently applied force in the range of about 5-30 pounds and (2) disposing the adhesive in the annular volume without disassembling the dry fitted joint.

14. The structure of claim 13, wherein each strut element is attached at a first end with a first leg of a first coupling node and is attached at a second end with a second leg of a second coupling node, each coupling node including a plurality of legs, and the first leg being substantially longer than the second leg.

15. A method for fabricating a structure, the method comprising:
forming a dry fit assembly of a 3-D closed truss structure including at least four coupling nodes and at least six strut elements connected at a plurality of joints, each coupling node being attached with at least two strut elements, each strut element disposed between and attached with a respective pair of the plurality of coupling nodes, the dry fit assembly being self-supporting;
aligning the dry fit assembly; and
rigidizing each joint, without disassembling the joint, by disposing an adhesive in an annular volume between a mating surface of a respective coupling node and a mating surface of a respective strut element and allowing the adhesive to cure; wherein
each of the plurality of joints is configured to be assembled by forming a dry-fitted joint, prior to disposing the adhesive, the dry fitted joint configured to resist gravitational forces and incidental contact, and to permit alignment of the dry fitted joint by yielding to a persistently applied force in the range of about 5-30 pounds and (2) disposing the adhesive in the annular volume without disassembling the dry fitted joint.

16. The method of claim 15, wherein each strut element is attached at a first end with a first leg of a first coupling node and is attached at a second end with a second leg of a second coupling node, the first leg being substantially longer than the second leg.

17. The method of claim 15, wherein, between the step of aligning the dry fit assembly and the step of rigidizing each joint, disassembly of any joint is avoided.

\* \* \* \* \*